United States Patent [19]
Takano

[11] Patent Number: 5,140,179
[45] Date of Patent: Aug. 18, 1992

[54] MASTER-SLAVE TYPE FLIP-FLOP CIRCUIT

[75] Inventor: Chiaki Takano, Kanagawa, Japan

[73] Assignee: Sony Corporation, Tokyo, Japan

[21] Appl. No.: 731,258

[22] Filed: Jul. 17, 1991

[30] Foreign Application Priority Data

Jul. 18, 1990 [JP] Japan .................. 2-188100

[51] Int. Cl.⁵ .................. H03K 3/289; H03K 3/29
[52] U.S. Cl. .................. 307/272.2; 307/279; 307/289; 307/291
[58] Field of Search ........... 307/279, 289, 291, 272.2; 377/74, 78-79

[56] References Cited

U.S. PATENT DOCUMENTS

| | | | |
|---|---|---|---|
| 3,042,815 | 5/1960 | Campbell, Jr. ............ | 307/272.2 |
| 3,573,509 | 4/1971 | Crawford .................. | 377/79 |
| 4,057,741 | 11/1977 | Piguet ...................... | 377/79 |
| 4,939,384 | 7/1990 | Shikata et al. ............ | 307/272.2 |

FOREIGN PATENT DOCUMENTS

| | | |
|---|---|---|
| 0144654 | 10/1984 | European Pat. Off. . |
| 0373893 | 12/1989 | European Pat. Off. . |
| 55-140321 | 11/1980 | Japan . |
| 57-206072 | 12/1982 | Japan . |
| 60-010810 | 1/1985 | Japan . |
| 62-071274 | 9/1987 | Japan . |
| 01050568 | 6/1989 | Japan . |
| 2-034018 | 2/1990 | Japan . |

OTHER PUBLICATIONS

M. Tsunotani et al., "Advanced Self-Alignment Process Technique with Very Thick Sidewall for High Speed GaAs LSIs", Dec. 1988, pp. 700-703, IEDM Tech. Digest.

Malcolm E. Goodge, "Semiconductor Device Technology", 1983, pp. 240-244.

*Primary Examiner*—Stanley D. Miller
*Assistant Examiner*—Margaret Rose Wambach
*Attorney, Agent, or Firm*—Hill, Van Santen, Steadman & Simpson

[57] ABSTRACT

A master-slave type flip-flop circuit with first and second transmission gates receives an input pulse signal and an inverted input pulse signal at a data input terminal and an inverted data input terminal, respectively, and receives a clock signal at a common clock input terminal. A first data holding section includes first and second inverters and first and second resistors cross-connected between input and output terminals of the first and second inverters for receiving outputs of the first and second transmission gates at the input terminals of the first and second inverters. Third and fourth transmission gates receive outputs of the first and second inverters, respectively, of the data holding section and further receive an inverted clock signal at a common inverted clock input terminal. A second holding data section includes third and fourth inverters and third and fourth resistors cross-connected between input and output terminals of the third and fourth inverters fro receiving output of the third and fourth transmission gates at the input terminals of the third and fourth inverters, respectively, The flip-flop circuit is reduced in total number of inverters and hence in power consumption and further reduced in number of inverters on a signal transmission line to permit high-speed operation. Where first to fourth capacitors are connected in parallel to the first to fourth resistors, respectively, the speed of-charging and discharging of gate capacity of the transmission gates can be raised to assure a higher maximum operating frequency.

5 Claims, 5 Drawing Sheets

ABSTRACT UNAVAILABLE

MASTER-SLAVE TYPE FLIP-FLOP CIRCUIT

FIELD OF THE INVENTION

This invention relates to a master-slave type flip-flop circuit, and more particularly to a master-slave type flip-flop circuit which is low in power consumption, high in operating speed and suitable for use with an optical communication system.

DESCRIPTION OF THE PRIOR ART

A maste-slave type flip-flop circuit is conventionally knwon which is constituted, for example, from a compound semiconductor (GaAs) IC (integrated circuit) wherein a GaAs MES FET (GaAs metal semiconductr field effect transistor) is employed as a logic gater element as disclosed, for example, in Japanese Patent Laid-Open Application No. 63-280509.

Referring to FIG. 1, there is shown in circuit diagram an exemplary one of such conventional master-slave type flip-flop circuits. The flip-circuit shown includes first to eight NOR circuits $NOR_1$ to $NOR_8$. The third and fourth NOR circuits $NOR_3$ and $NOR_4$ and the seventh and eight NOR circuits $NOR_7$ and $NOR_8$ each constitute a flip-flop circuit. The first and second NOR circuits $NOR_1$ and $NOR_2$ are connected to receive an input pulse signal and an inverted input pulse signal by way of a data input terminal $D_1$ and an inverted data input terminal $D_2$, respectively, and to receive a clock signal signal by way of a clock input terminal $CLK_1$. The fifth and sixth NOR circuits $NOR_5$ and $NOR_6$ are connected to receive outputs of the third and fourth NOR circuits $NOR_3$ and $NOR_4$, respectively, and to receive an inverted clock signal by way of an inverted clock input terminal $CLK_2$. Outputs of the seventh and eighth NOR circuits $NOR_7$ and $NOR_8$ are connected to an output terminal $OUT_1$ and an inverted output terminal $OUT_2$, respectively, of the master-slave type flip-flop circuit. It is to be noted that each of the NOR circuits $NOR_1$ to $NOR_8$ is constituted from a logic gate formed from, the example, a GaAs MES FET.

The master-slave type flip-flop circuit of FIG. 1 has a drawback in that a high speed operation cannot be anticipated because the first NOR circuit $NOR_1$, third NOR circuit $NOR_3$, fifth NOR circuit $NOR_5$ and seventh NOR circuit $NOR_7$ (or the second NOR circuit $NOR_2$, fourth NOR circuit $NOR_4$, sixth NOR circuit $NOR_6$ and eight NOR circuit $NOR_8$) are present on a signal transmission line and, if the gate delay time by one NOR circuit is, for example, 30 ps where each gate is formed from a GaAs MES FET, then the total delay time is 120 ps.

SUMMARY OF THE INVENTION

Accordingly, it is an object of the present invention to provide a master-slave type flip-flop circuit which has a reduced delay time.

In order to attain the object, according to the present invention, a master-slave type flip-flop circuit comprises first and second transmissiomn gates for receiving an input pulse signal and an inverted input pulse signal at a data input terminal and an inverted data input terminal, respectively, and for receiving a clock signal at a common clock input terminal, a first data holding section including first and second inverters and first and second resistors cross connected between input and output terminals of said first and second inveters for receiving outputs of said first and second transmission gates at the input terminals of said first and second inverters, respectively, third and fourth transmission gate for receiving outputs of said first and second inverters, respectively, of said first data holding section and for receiving an inverted clock signal at a common inverted clock input terminal, and a second data holding section including third and fourth inverters and third and fourth resistors cross connected between input and output terminals of said third and fourth inverters for receiving outputs of said third and fourth transmission gates at the input terminals of said third and fourth inverters, respectively. The flip-flop circuit is reduced in total number of inverters and hence in power consumption and further reduced in number of inverters on a signal transmission line to permit a high speed operation.

Each of the elements of the first to fourth transmission gates and elements of said first to fourth inverters may be formed from a GaAs field effect transistor, and first to fourth capacitors may be connected in parallel to said first to fourth resistors, respectively.

With the master-slave type flip-flop circuit, the number of inverters on a signal transmission line is reduced so that a high speed operation twice that of a conventional master-slave type flip-flop circuit can be achieved.

Further, as capacities between the gates and source of GaAs FETs of the first to fourth transmission gates are charged and discharged by way of the first and fourth capacitors connected in parallel to the first to fourth resistors, respectively, a high maximum operating frequency can be assured.

The above and other objects, features and advantages of the present invention will become apparent from the following description and the appended claims, taken in conjunction with the accompanying drawings in which like parts or elements are denoted by like reference characters.

DESCRIPTION OF THE PREFERRED EMBODIMENTS

Figure 1:
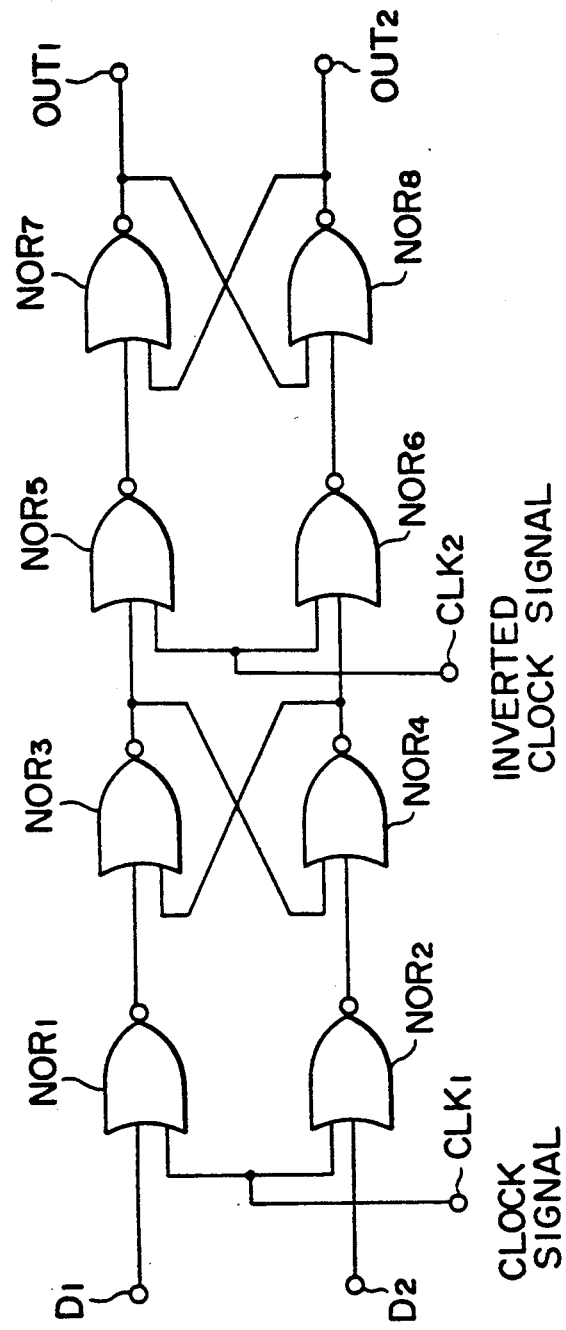
FIG. 1 is a circuit diagram showin an exemplary one of conventional master-slave type flip-flop circuits.
Figure 2:
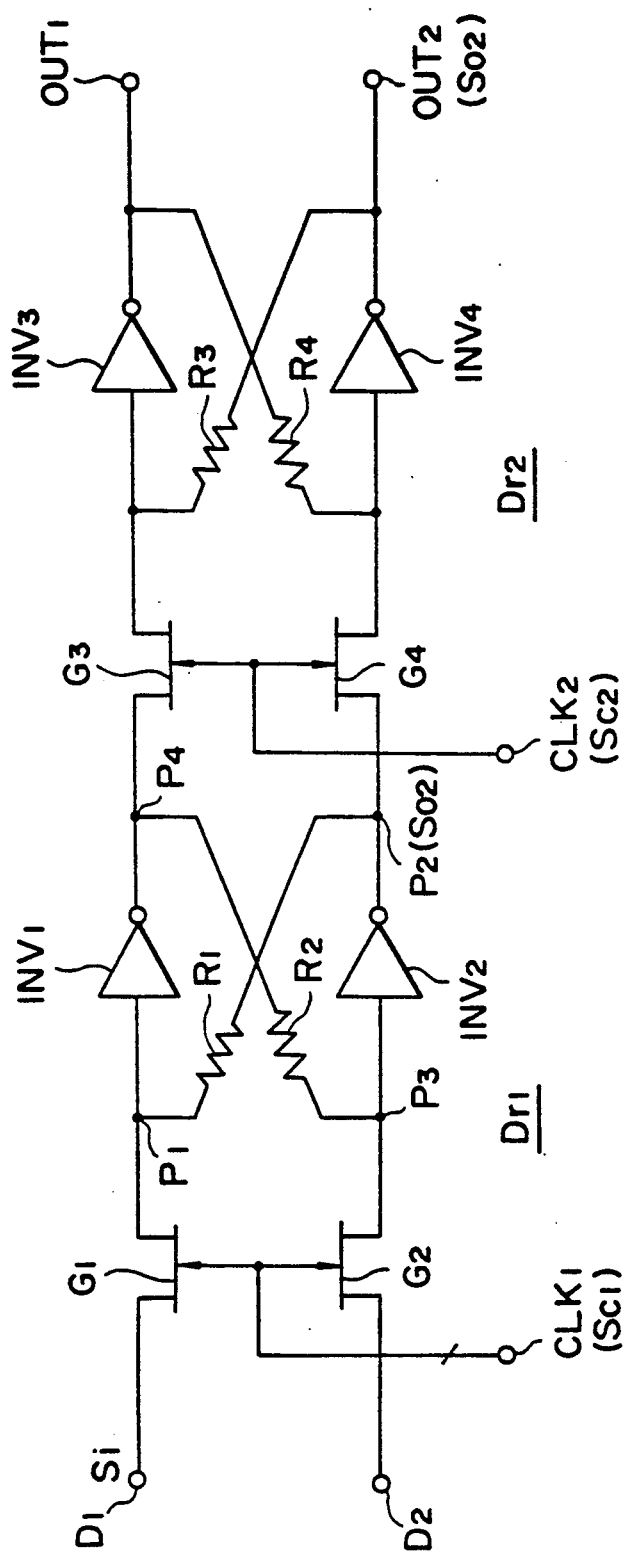
FIG. 2 is a circuit diagram showing a master-slave type flip-flop circuit to which the present invention is applied.
Figure 3:
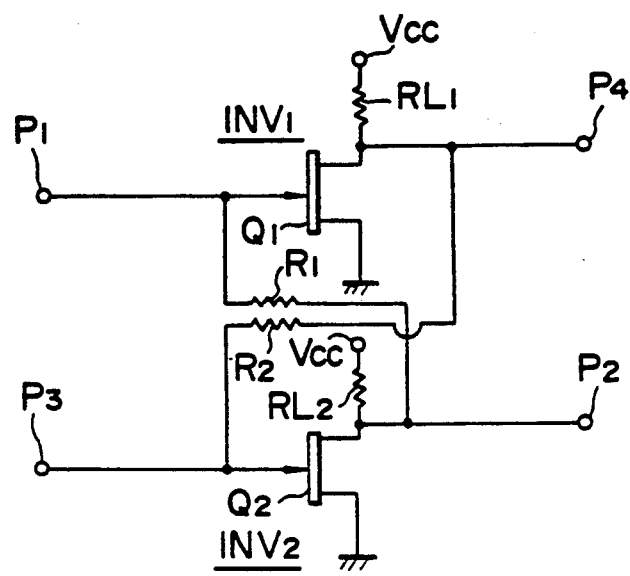
FIG. 3 is a circuit diagram showing details of a data holding section of the master-slave type flip-flop circuit of FIG. 2.

Referring first to FIG. 2, there is shown in circuit diagram a master-slave type flip-flop circuit according to which the present invention is applied. The master-slave type flip-flop circuit shown has a data input terminal $D_1$ and an inverted data input terminal $D_2$ and includes first to fourth transmission gates $G_1$ to $G_4$ each formed form, for example, a GaAs FET such as GaAs MES FET, a GaAs JFET (junction type field effect transistor) or a GaAs HEMT (high electron mobiltiy transistor), and first to fourth inverters $INV_1$ to $INV_4$. A clock signal $S_{o1}$ is supplied to the first and second gates $G_1$ and $G_2$ by way of a clock input terminal $CLK_1$ while an inverted clock signal $\overline{S_{o1}}$ is supplied to the third and fourth gates $G_3$ and $G_4$ by way of an inverted clock input terminal $CLK_2$. The master-slave type flip-flop circuit further has an output terminal $OUT_1$ and an inverted output terminal $OUT_2$. The master-slave type flip-flop circuit further includes a first resistor $R_1$ connected betwen an input terminal $P_1$ of the first inverter $INV_1$ and an output terminal $P_2$ of the second inverter $INV_2$. A second resistor $R_2$ is connected between an input terminal $P_3$ of the second inverter $INV_2$ and an output terminal $P_4$ of the first inverter $INV_1$. A third resistor $R_3$ is connected between an input terminal of the third inverter $INV_3$ and the inverted output terminal $OUT_2$ of the fourth inverter $INV_4$. A fourth resistor $R_4$ is connected betwen an input terminal of the fourth inverter $INV_4$ and the output terminal $OUT_1$ of the third inverter $INV_3$. The master-slave type flip-flop circuit further includes a first data holding section $D_{r1}$ composed of the first and second inverters $INV_1$ and $INV_2$ and the first and second resistor $R_1$ and $R_2$, and a second data holdin section $D_{r2}$ composed of the third and fourth inverters $INV_3$ and $INV_4$ and the third and fourth resistors $R_3$ and $R_4$. Each of the first to fourth inverters $INV_1$ to $INV_4$ employs, as seen from FIG. 3 which shows a data holding section of a master-slave type flip-flop circuit of the present invention, a pair of GaAs FETs $Q_1$ and $Q_2$ such as, for example, GaAs MES FETs, GaAs JFETs or GaAs HEMTs as logic gate elements. It is to be noted that, while only the first data holding section $D_{r1}$ is shown in FIG. 3, also the second data holding section $D_{r2}$ has a substantially similar construction. In FIG. 3, reference characters $RL_1$ and $RL_2$ denote each a load resistor formed from a depletion type GaAs MES FET or the like, and $V_{cc}$ a power source terminal.

Subsequently, operation of the master-slave type flip-flop circuit will be described with reference to FIG. 4.

Figure 4:
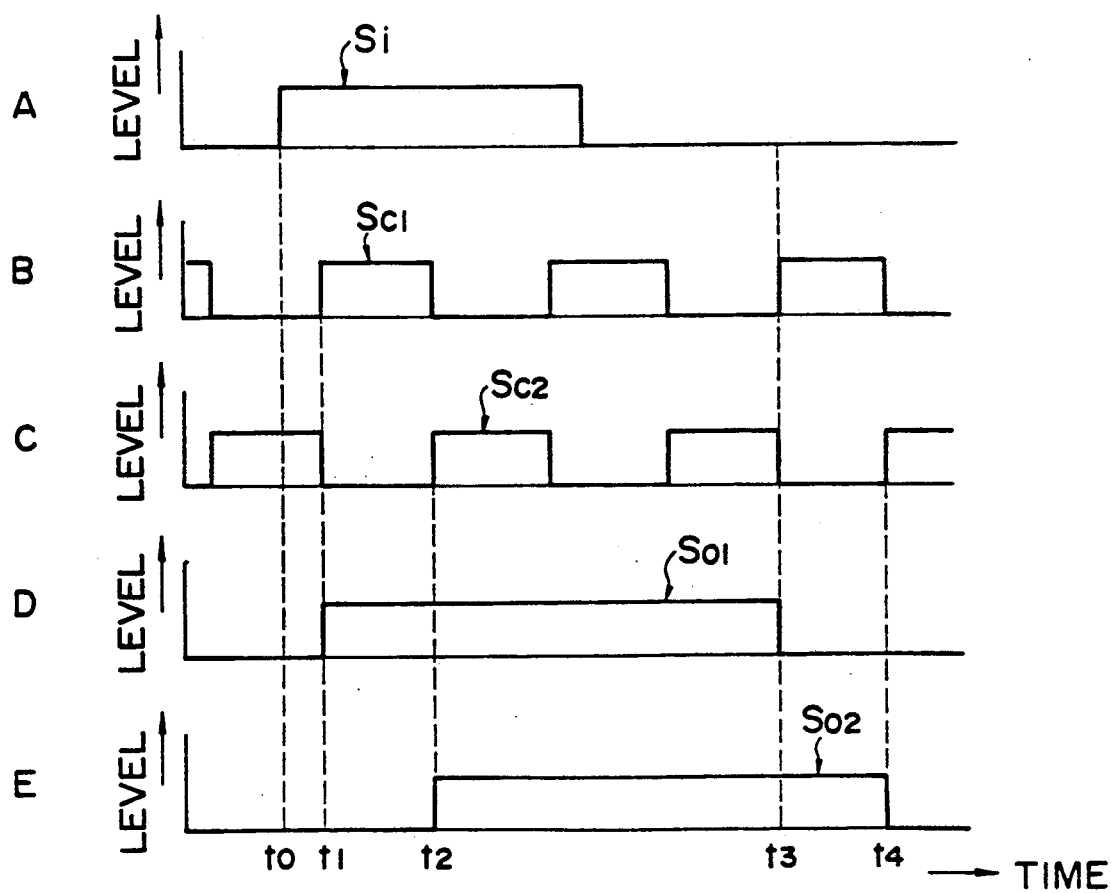
FIG. 4 is a timing chart illustrating operation of the master-slave type flip-flop circuit of FIG. 2.

When such an input pulse signal $S_1$ as seen from a waveform curve A shown in FIG. 4 is supplied to the data input terminal $D_1$ at the time $t_0$ and simultaneously another input signal similar to but inverted in phase from the input pulse signal $S_1$ is supplied to the inverted data input terminal $D_2$, the first data holding section $D_1$ is set at another time $t_1$ of a rising edge of a clock signal $S_{c1}$ shown by a waveform curve B in FIG. 4 which is supplied to the first and second transmission gates $G_1$ and $G_2$ by way of the clock input terminal $CLK_1$. The first data holding section $D_{r1}$ is reset at a further time $t_3$ after then. Consequently, such an output pulse signal $S_{o1}$ as shown by a waveform curve D in FIG. 4 appears at the output terminal $P_2$ of the second inverter $INV_2$. Then, the second data holding section $Dr_2$ is set at a different time $t_2$ of a rising edge of an inverted clock signal $S_{c2}$ shown by a waveform curve C in FIG. 4 whch is supplied to the inverted clock input terminal $CLK_2$, and is then reset at another time $t_4$. Consequently, such an output pulse signal $S_{o2}$ as shown by a waveform curve E in FIG. 4 appears at the output terminal $OUT_2$ of the fourth inverter $INV_4$. When the second transmission gate $G_2$ is turned on at the time $t_1$, an output voltage of the second gate $G_2$ prevails over a feedback voltage supplied thereto from the output terminal $P_4$ of the first inverter $INV_1$ by way of the second resistor $R_2$ thereby to invert the second inverter $INV_2$ from a reset state into a set state. Then, a holding current is supplied to the second inverter $INV_2$ by way of the second resistor $R_2$ in order to hold the set state of the second inverter $INV_2$. On the other hand, when the fourth transmission gate $G_4$ is turned on at the time $t_2$, an output voltage of the fourth gate $G_4$ prevails over a feedback voltage supplied thereto from the output terminal $OUT_1$ of the third inventer $INV_3$ by way of the fourth resistor $R_4$ thereby to invert the fourth inverter $INV_4$ from a reset state into a set state. Then, a holding current is supplied to the fourth inverter $INV_4$ by way of the fourth resistor $R_4$ in order to hold the set state of the fourth inverter $INV_4$.

In this instance, if the delay time of each of the second and fourth inverter $INV_2$ and $INV_4$ is 30 ps and the delay time of each of the second and fourth transmission gates $G_2$ and $G_4$ is 5 ps, then the operating time of the master-slave type flip-flop circuit is 70 ps, which is about one half that of such conventional master-slave type flip-flop circuit as described hereinabove.

Subsequently, an exemplary application of a master-slave type flip-flop circuit according to the present invention will be described with reference to FIG. 5 which shows a data identifying circuit of an optical communication system.

Figure 5:
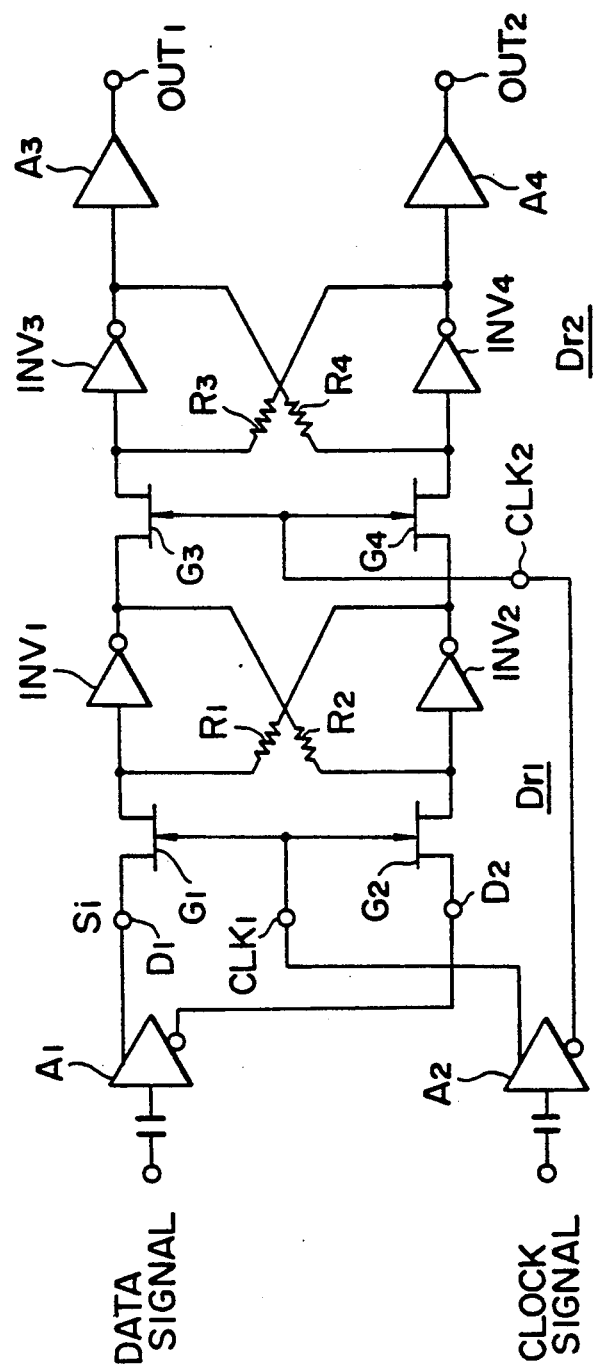
FIG. 5 is a circuit diagram of a data identifying circuit of an optical communication system to which a master-slave type flip-flop circuit according to the present invention is incorporated.

The data identifying circuit shown in FIG. 5 includes an input amplifier $A_1$ which receives a data signal of an operating speed of, for example 2.4 Gb/s and supplies an input pulse signal $S_i$ to a data input terminal $D_1$ and also supplies to another inverted data input terminal $D_2$ an inverted input pulse signal similar to but inverted in phase to the input pulse signal $S_i$. Another input amplifier $A_2$ receives a clock signal having a higher frequency than the data signal and supplies a clock signal and an inverted clock signal to a clock input terminal $CLK_1$ cna an inverted clock input terminal $CLK_2$, respectively. Then, whether data supplied to the input amplifier $A_1$ is a mark (high level) or a space (low level) is detected in synchronism with the inverted clock signal at the inverted clock input terminal $CLK_2$, and a result of such detection is held in the fourth inverter $INV_4$. The data identifying circuit further includes a pair of output amplifiers $A_3$ and $A_4$.

Also with the data identifying circuit shown in FIG. 5, similar effects to those of the master-slave type flip-flop circuit shown in FIG. 2 can be anticipated.

Figure 6:
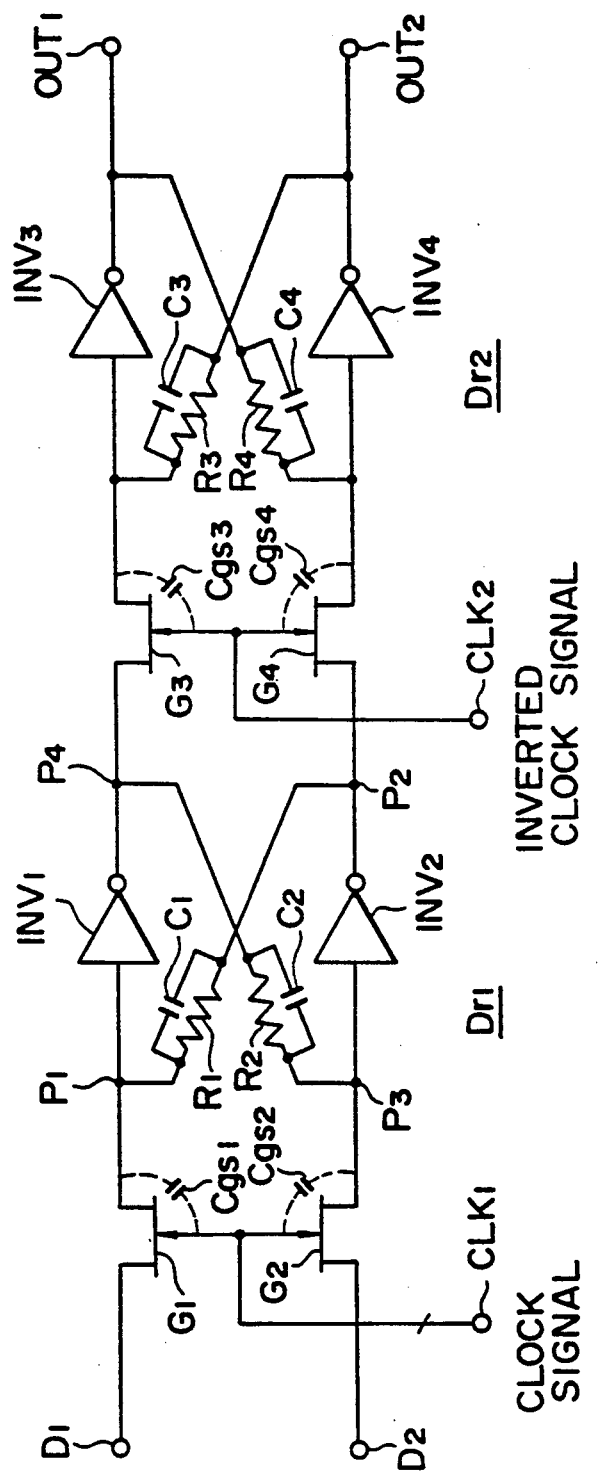
FIG. 6 is a circuit diagram showing a modification to the master-slave type flip-flop circuit of FIG. 2.

Referring now to FIG. 6, there is shown in circuit diagram a modification to the master-slave type flip-flop circuit shown in FIG. 2. The modified master-slave type flip-flop circuit has a substantially similar construction to that of the master-slave type flip-flop circuit of FIG. 2 but additionally includes first to fourth capacitors $C_1$ to $C_4$ connected in parallel to the first to fourth resistors $R_1$ and $R_4$, respectively. Further, each of the first to fourth transmission gates $G_1$ to $G_4$ is formed froma GaAs FET.

In the modified master-slave type flip-flop circuit, charging and discharging of capacities $C_{gs1}$ to $C_{gs5}$ between the gates and sources of GaAs FETs forming the first to fourth transmission gates $G_1$ to $G_4$ take place by way of the first to fourth capacitors $C_1$ to $C_4$, respectively. Accordingly, possible deterioration of the first to fourth resistors $R_1$ to $R_4$ and the first to fourth capacitors by time constants is eliminated and the maximum operating frequency can be raised.

As apparent from the foregoing description, with a master-slave type flip-flop circuit of the present invention, as the number off inventers on a signal transmission line is reduce, a high speed operation twice that of a conventional master-slave type flip-flop circuit can be achieved.

Further, as capacities between the gates and sources of GaAs FETs of first to fourth transmission gates are charged and discharged by way of first and fourth capacitors connected in parallel to first to fourth resistors, respectively, there is an advantage that the maximum operating frequency can be raised.

Having now fully described the invention, it will be apparent to one of ordinary skill in the art that many changes and modifications can be made thereof without departing from the spirit and scope of the invention as set forth herein.

What is claimed is:

1. A master-slave type flip-flop circuit comprising:
   (a) first and second transmission gates for receiving an input pulse signal and an inverted input pulse signal at a data input terminal and an inverted data input terminal, respectively, and for receiving a clock signal at a first common clock input terminal;
   (b) a first data section including first and second inverters and first and second resistors cross-connected between input and output terminals of said first and second inverters for receiving outputs of said first and second transmission gates at the input terminal of said first and second inverters, respectively;
   (c) third and fourth transmission gates for receiving outputs of said first and second inverters of said first data holding section, respectively, and for receiving an inverted clock signal at a second common inverted clock input terminal; and
   (d) a second data holding section including third and fourth inverters and third and fourth resistors cross-connected between input and output terminals of said third and fourth inverters for receiving outputs of said third and fourth transmission gates at the input terminals of said third and fourth inverters, respectively.

2. The master-slave type flip-flop circuit according to claim 1, further comprising first to fourth capacitors connected in parallel to said first to fourth resistors, respectively.

3. The master-slave type flip-flop circuit according to claim 1, wherein each element of said first to fourth transmission gates and each element of said first to fourth inverters is formed from a GaAs field effect transistor.

4. The master-slave type flip-flop circuit according to claim 3, wherein each of said elements of said first to fourth transmission gates and said elements of said first to fourth inverters is formed from a GaAs metal semiconductor field effect transistor.

5. The master-slave type flip-flop circuit according to claim 3, wherein each of said elements of said first to fourth transmission gates and said elements of said first to fourth inverters is formed from a GaAs junction type field effect transistor.

* * * * *